(12) United States Patent
Tsen

(10) Patent No.: US 6,282,119 B1
(45) Date of Patent: Aug. 28, 2001

(54) MIXED PROGRAM AND SENSE ARCHITECTURE USING DUAL-STEP VOLTAGE SCHEME IN MULTI-LEVEL DATA STORAGE IN FLASH MEMORIES

(75) Inventor: Huan-Chiu Tsen, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/585,422

(22) Filed: Jun. 2, 2000

(51) Int. Cl.$^7$ .................................................. G11C 16/04
(52) U.S. Cl. .............................. 365/185.19; 365/185.18; 365/185.03
(58) Field of Search .................... 365/185.19, 185.18, 365/184, 185.03

(56) References Cited

U.S. PATENT DOCUMENTS 5,424,978   6/1995   Wada et al. .
6,040,996 *  3/2000   Kong ............................... 365/185.19

* cited by examiner

Primary Examiner—Huan Hoang
(74) Attorney, Agent, or Firm—Finnegan, Henderson, Farabow, Garrett & Dunner, L.L.P.

(57) ABSTRACT

A non-volatile semiconductor memory device for storing one of a plurality of different data values in an individual memory cell within a memory array. The device includes two circuits for producing two stepped voltage waveforms that are applied to the source and the drain of the memory cell to be programmed. The stepped voltages cause electrons to tunnel onto and charge the floating gate of the memory cell and the amount of charge stored on the floating gate is correlated to the data value to be stored in the memory cell.

20 Claims, 6 Drawing Sheets

MIXED PROGRAM AND SENSE ARCHITECTURE USING DUAL-STEP VOLTAGE SCHEME IN MULTI-LEVEL DATA STORAGE IN FLASH MEMORIES

BACKGROUND OF THE INVENTION

1. Field of the Invention

The present invention pertains in general to a nonvolatile memory device capable of having data electrically written therein, and more particularly, a nonvolatile memory device capable of selectively writing one of a plurality of values therein, and a method thereof.

2. Description of the Related Art

An Electrically Programmable Read-Only Memory ("EPROM") or a flash memory cell with a floating gate may be programmed by depositing electrons in the floating gate of the cell by electrons that tunnel from the cell substrate through a thin oxide layer disposed between the floating gate and the substrate. The tunneling electrons may be created by hot electron injection or Fowler Nordheim tunneling.

In a hot electron injection scheme, a high voltage is applied to the control gate of the cell and a low or zero voltage is applied to the drain region of the memory cell. Injection of electrons into the floating gate occurs when electrons in the channel region between the source and the drain regions of the cell attain an energy level higher than the barrier potential of the thin oxide layer. Some electrons will tunnel through the thin oxide layer and are injected into the floating gate, thereby depositing charges in the floating gate. For Fowler-Nordheim tunneling, a high voltage is applied to the control gate and a low voltage is applied to the drain region, and some electrons tunnel through the thin oxide layer to the floating gate.

However, not all electrons will attain an energy sufficient to tunnel through the thin oxide layer. The probability that an electron will tunnel through the thin oxide layer is proportional to the voltage difference between the control gate and the drain region. In addition, a charge proportional to the voltage difference between the control gate and drain will appear on the floating gate. The charge imposes an electric field on the channel region, known as the threshold voltage of the memory cell.

The threshold voltage determines whether a conventional memory cell is said to be storing any data or value. For example, a logic value of "0" is represented by setting a high threshold voltage and a logic value of "1" is represented by a low threshold voltage. Due to an increasing demand for memory storage capacity together with a decrease in available physical space, it is desirable to increase the memory storage capacity of individual memory cells. One attempt is described in U.S. Pat. No. 5,424,978 to Wada et al., which is hereby incorporated herein by reference.

Wada et al. describes a method and apparatus for storing more than two values within a single memory cell using hot electron injection. During programming, a high voltage pulse is sent to the drain of a memory cell. At the same time, a selected voltage from a stepped voltage signal is applied to the control gate. By applying the same voltage pulse to the drain at different times during the stepped voltage signal cycle, different levels of charges are stored in the floating gate. Therefore, each step of the stepped voltage signal produces a different threshold voltage in the memory cell, and, therefore, a plurality of "data" in the memory cell.

The method described in Wada et al. is limited in that the levels of the drain and control gate voltages are linked. For hot electron injection, the drain and control gate voltages must be set in a narrow requisite voltage range in relation to the other in order to create electrons having enough energy to tunnel through the thin oxide layer. The minimum requisite voltage is the threshold voltage of producing a charge on the floating gate, and the maximum requisite voltage is limited by the memory cell tolerance.

In general, the voltage applied to the control gate is fixed and the voltage applied to the drain is modulated to create different threshold voltage distributions. Because of cell tolerance, however, the voltage applied to the drain must be below the breakdown voltage to avoid the punch through effect. As a result, the allowable voltage difference between that applied to the drain and that applied to the floating gate is limited, thereby limiting the number of possible data that may be storage in the memory cell.

SUMMARY OF THE INVENTION

Accordingly, the present invention is directed to a nonvolatile memory device capable of storing more than two values in each of the memory cells and a method thereof that substantially obviates one or more problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims thereof, as well as the appended drawings.

To achieve these and other advantages, and in accordance with the purpose of the invention as embodied and broadly described, there is provided a nonvolatile semiconductor memory device including a memory cell array and capable of selectively writing one of a plurality of data values into individual memory cells in the memory cell array that includes rows and columns of memory cells, each of the memory cells having a control gate, a floating gate, a source and a drain. The device includes a first variable voltage oscillating circuit for producing a first stepped voltage to be applied to a selected memory cell, and a second variable voltage oscillating circuit for producing a second stepped voltage to be applied to the selected memory cell.

In one aspect of the invention, the first variable voltage oscillating circuit is, coupled to apply the first stepped voltage to the drain of the selected memory cell, and the second variable voltage oscillating circuit is coupled to apply the second stepped voltage to the control gate of the selected memory cell.

In another aspect of the invention, the device further includes an x-decoder coupled to the second variable voltage oscillating circuit for selecting a row of memory cells including the selected memory cell, and for applying the second stepped voltage to the control gates of the row of memory cells, a bit line selector coupled to the first variable voltage oscillating circuit, and a y-decoder coupled to the bit line selector for selecting a column of memory cells including the selected memory cell, and for applying the first stepped voltage to the drains of the column of memory cells.

In yet another aspect of the invention, the data values which can be written into each of the memory cells is equal to a number of ranges of values of charge which can be stored on the floating gate of the memory cell.

In still another aspect of the invention, the device additionally includes a timing circuit for producing trigger signals in response to a data value to be stored, wherein the first variable voltage oscillating circuit and the second variable voltage oscillating circuit initiate the first and second stepped variable voltage signals upon receiving the trigger signals, and hold the voltage signals at respective constant voltage values when the trigger signals stop.

Also in accordance with the present invention, there is provided a nonvolatile memory device that includes a memory array having a plurality of memory cells, each of the plurality of memory cells including a drain, a source, a control gate and a floating gate, a first variable voltage oscillating circuit coupled to the drain of a selected one of the plurality of memory cells for providing a first stepped voltage waveform, and a second variable voltage oscillating circuit coupled to the control gate of the selected one of the plurality of memory cells for providing a second stepped voltage waveform, wherein the first stepped voltage waveform and the second stepped voltage waveform cause the selected one of the plurality of memory cells to store one of a plurality of data values.

Further in accordance with the present invention, there is provided a method of selectively writing one of a plurality of possible data values into a non-volatile semiconductor memory device having a memory array including a plurality of memory cells, each of the memory cells having a control gate, a floating gate, a channel region, a drain, and a source that includes receiving a data value to be written into a memory cell, translating the received data value into a threshold voltage to be written into the memory cell, applying a first stepped voltage to the control gate of the memory cell, and applying a second stepped voltage to the drain of the memory cell.

In one aspect of the invention, the first stepped voltage and the second stepped voltage produce a voltage difference between the floating gate and the channel region of the memory cell, thereby causing electrons to tunnel onto the floating gate from the channel region.

In another aspect of the invention, the step of applying a first stepped voltage includes repeating all of the voltage steps of the first stepped voltage for each of the voltage steps of the second stepped voltage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DETAILED DESCRIPTION OF THE PREFERRED EMBODIMENTS

Figure 1:
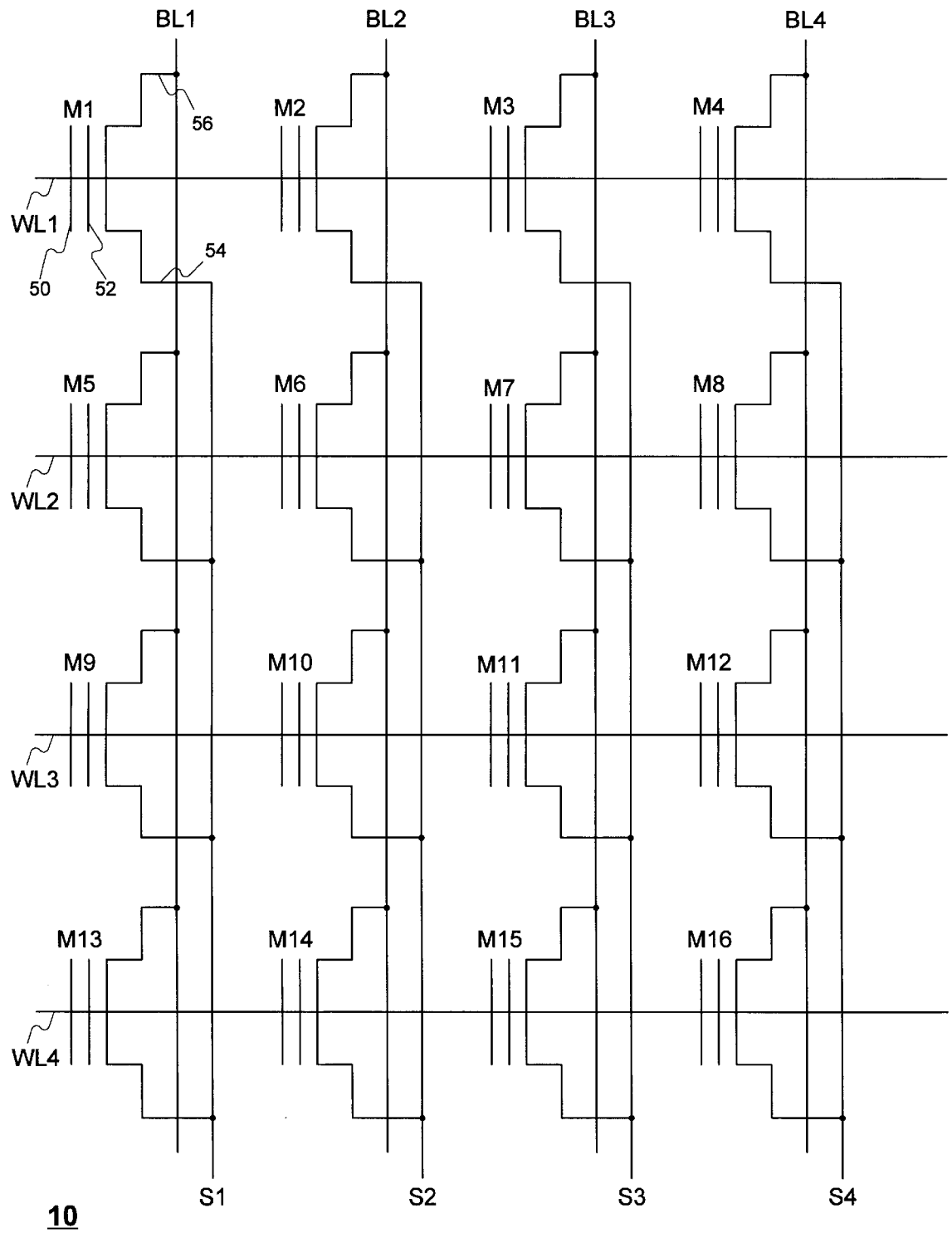
FIG. 1 is a schematic diagram of a memory array.

In accordance with the present invention, there is provided a nonvolatile memory device capable of storing more than two values in each memory cell and the method thereof. FIG. 1 is a schematic diagram of a nonvolatile memory array. Referring to FIG. 1, a memory array 10 includes a plurality of memory cells M1–M16. Each of cells M1–M16 includes a source 54, a drain 56, a control gate 50 and a floating gate 52. Memory array 10 also includes a plurality of bit lines BL1–BL4, word lines WL1–WL4, and source lines SL1–SL4. Source lines are sometimes known as sense lines.

Each of bit lines BL1–BL4 is coupled to the drains of the memory cells in the same column. For example, bit line BL1 is coupled to each of the drain 56 of memory cells M1, MS, M9, and M13. Each of word lines WL1–WL4 is coupled to the control gates of the memory cells in the same row. Word line WL1, for example, is coupled to each of the control gate 50 of memory cells M1, M2, M3, and M4. Each of source lines S1–S4 is coupled to the sources of the memory cells in the same column. Specifically, each of source lines SL1–SL4 is respectively coupled to the same column of memory cells as does each of bit lines BL1–BL4. Although memory cell array 10 shown in FIG. 1 only includes four rows and four columns, one skilled in the art would understand that FIG. 1 is for illustrative purposes only and should not be read to limit the scope of the present invention.

Figure 2:
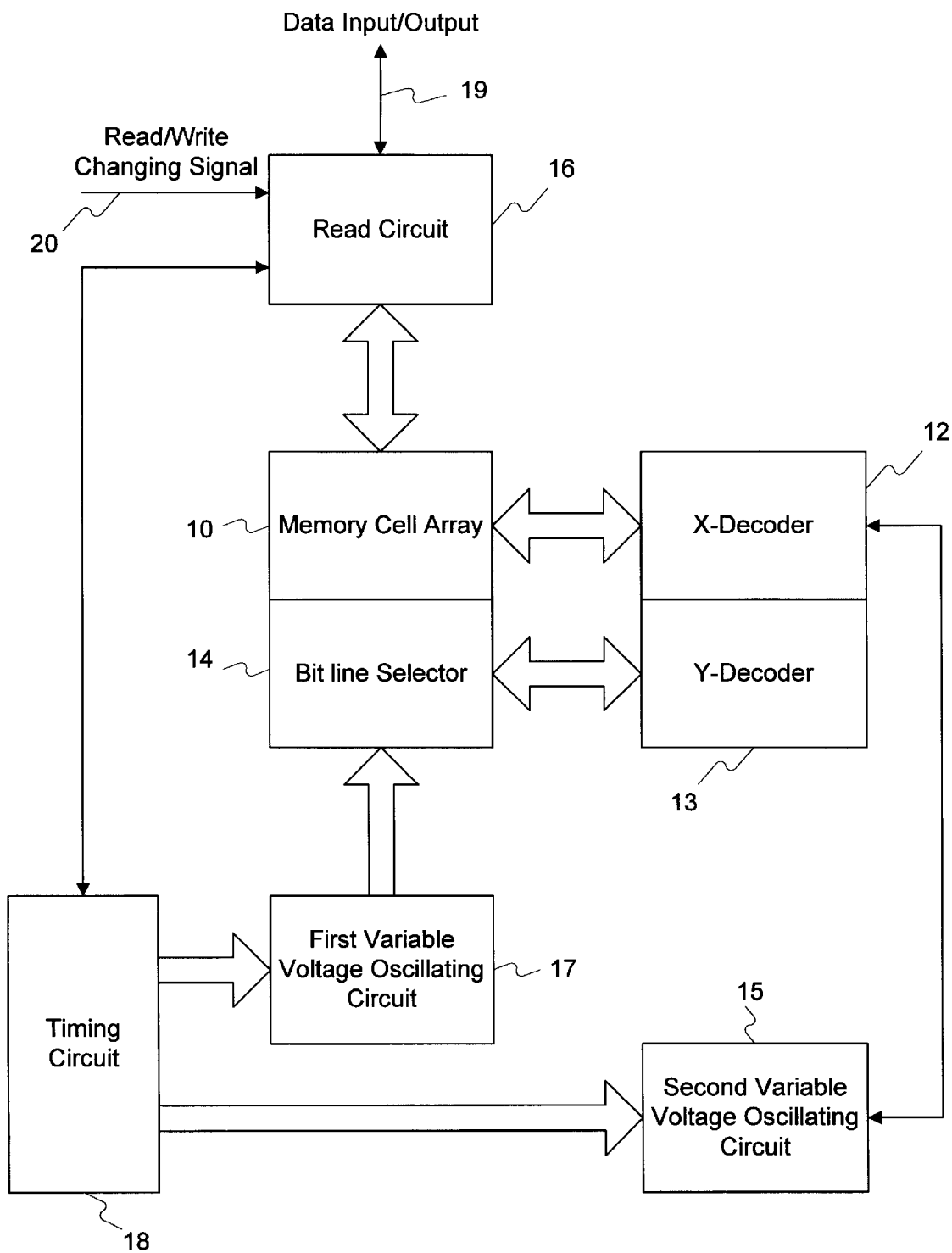
FIG. 2 is a block diagram of control circuits in accordance with the present invention.

FIG. 2 shows a block diagram of control circuits in accordance with the present invention. Referring to FIG. 2, there includes a data input/output 19, a read/write changing signal 20, a read circuit 16, memory cell array 10, an x-decoder 12, a y-decoder 13, a bit line selector 14, a first variable voltage oscillating circuit 17, a second variable voltage oscillating circuit 15, and a timing circuit 18.

Read circuit 16 is coupled to data input/output 19, timing circuit 18, and memory cell array 10, and receives read/write changing signal 20. Timing circuit 18 provides an output to first variable voltage oscillating circuit 17 and second variable voltage oscillating circuit 15. First variable voltage oscillating circuit 17 provides an output to bit line selector 14, and second variable voltage oscillating circuit 15 is coupled to x-decoder 12. Bit line selector 14 is coupled to y-decoder 13 and memory cell array 10. Memory cell array 10 is coupled to x-decoder 12 and read circuit 16.

For purposes of generally describing the present invention, memory-cell array 10 includes n rows and m columns. Accordingly, memory cell array 10 includes a plurality of word lines WL1–WLn, bit lines BL1–BLm, and source lines SL1–SLm. Word lines WL1–WLn of memory cell array 10 are coupled to x-decoder 12, and x-decoder 12 is capable of individually selecting any of word lines WL1–WLn. Bit lines BL1–BLm are coupled to bit line selector 14, which, together with y-decoder 13, is capable of individually selecting any one of bit lines BL1–BLm. Each of source lines SL1–SLm is respectively coupled to the sources of the memory cells coupled to bit lines BL1–BLm. Source lines SL1–SLM are also coupled to read circuit 16.

In operation, read circuit 16 is controlled by read/write changing signal 20 that selects read circuit 16 for one of two modes of operation, i.e., write mode and read mode. When read circuit 16 is selected by read/write changing signal 20 to be in the write mode, data received from data input/output 19 are written into memory array 10. Specifically, upon receipt of data to be written into memory array 10, read circuit 16 sends a control signal (not shown) to timing circuit 18. The control signal causes timing circuit 18 to produce trigger signals "A" and "B" (not shown), each having the same time length. Each data value to be programmed into a memory cell is correlated to a predetermined trigger signal time length.

Figure 3A:
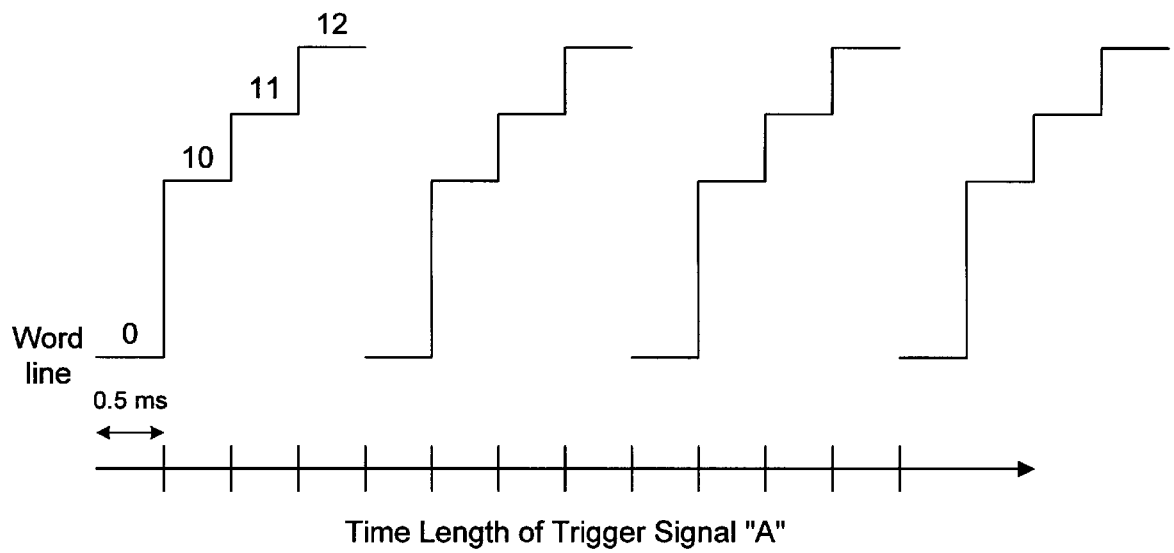
FIG. 3A is a timing diagram showing voltage values on a word line.

Trigger signals A and B are provided to second variable voltage oscillating circuit 15 and first variable voltage oscillating circuit 17, respectively. In response to trigger signal A, second variable voltage oscillating circuit 15 generates a stepped voltage waveform having voltage levels of 0V, 10V, 11V, and 12V, each voltage level having a duration of 0.5 ms. FIG. 3A illustrates trigger signal "A" in relation to the stepped voltage produced by second variable voltage oscillating circuit 15 in response to trigger signal "A".

Similarly, in response to trigger signal B, first variable voltage oscillating circuit 17 generates a stepped voltage waveform. Referring to FIG. 3A, first variable voltage oscillating circuit 17 generates a stepped voltage waveform having voltage levels 0V, 2V, 3V, and 4V, each voltage level having a duration of 2 ms.

Figure 3B:
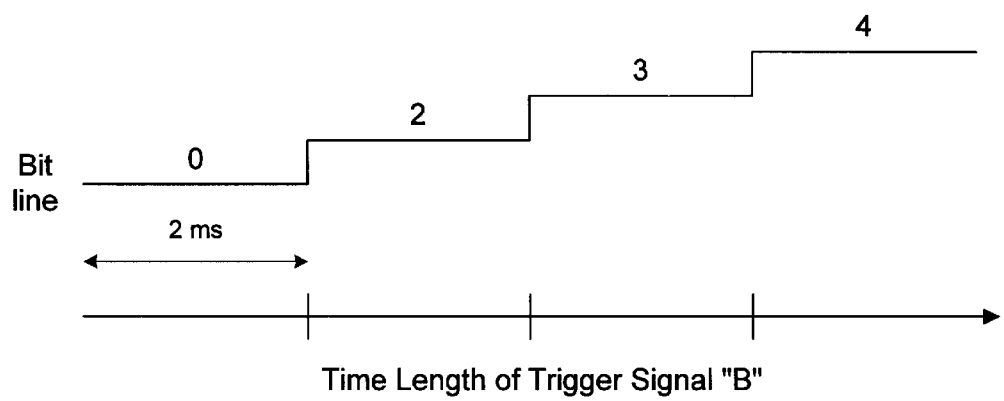
FIG. 3B is a timing diagram showing voltage values on a bit line.

FIG. 3B illustrates trigger signal "B" in relation to the stepped voltage produced by first variable voltage oscillating circuit 17 in response to trigger signal "B". The number of voltage steps and voltage levels are given as examples only. The timing of the stepwise changes are also given as examples. However, a complete cycle of voltage steps of the word line is completed for each stepwise change in the bit line voltage.

Figure 4:
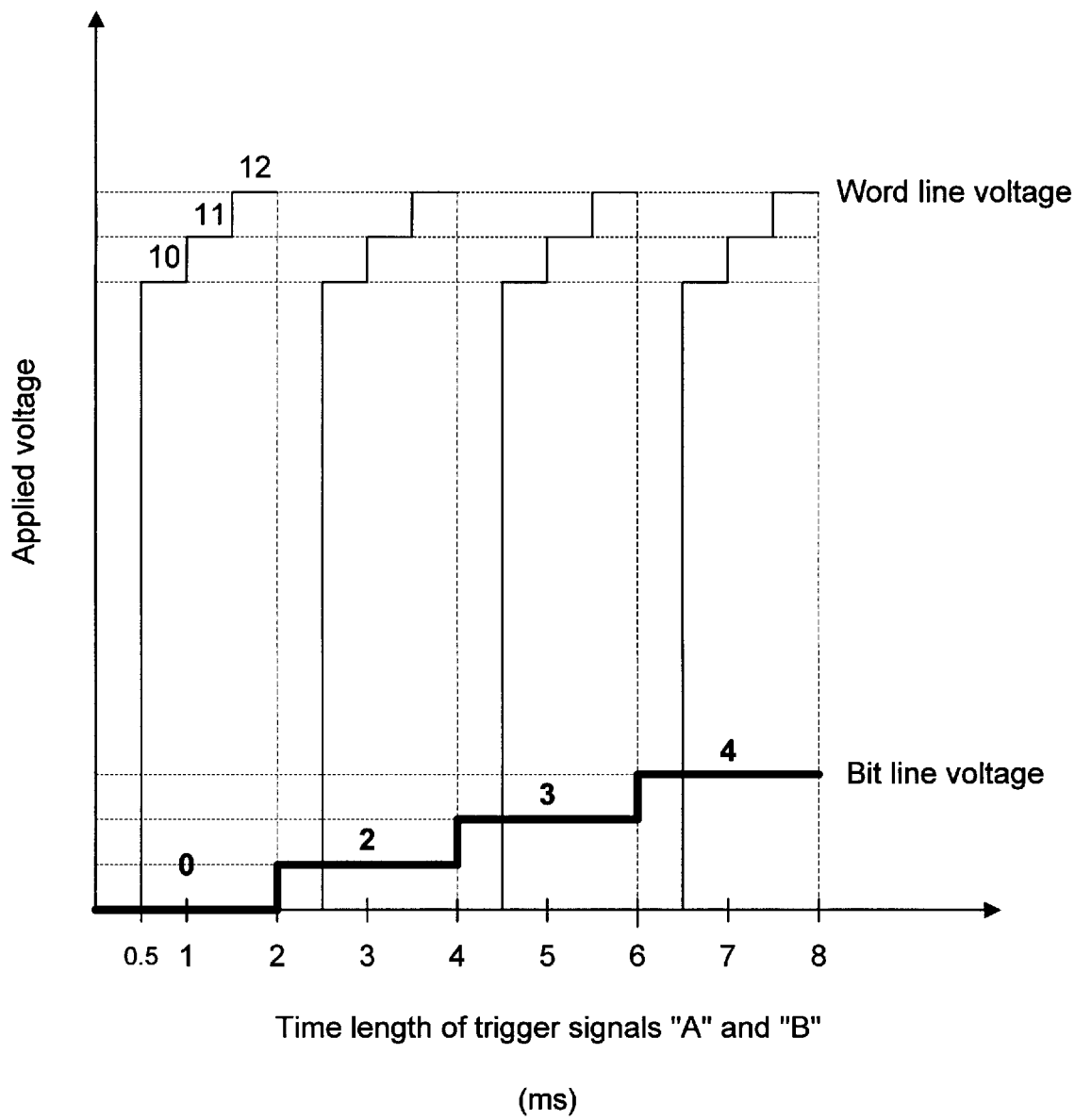
FIG. 4 is a timing diagram showing the relationship between the time length of trigger signals "A" and "B" and the voltages applied to the bit line and word line.

FIG. 4 is a timing diagram showing the relationship between the time length of trigger signals "A" and "B" and the voltages applied to the bit line and word line. Referring to FIG. 4, by setting the trigger signals at 0.5 ms, 10V is applied to the word line and 0V to the bit line. By setting the trigger signals at 2.0 ms, 0V is applied to the word line and 2V to the bit line. By setting the trigger signals at 5.0 ms, 11V is applied to the word line and 3V to the bit line. Similarly, the remaining available voltage differences shown in FIG. 4 are 0V, 6V, 7V, 8V, 9V, 10V, 11V, and 12V.

By selecting a given time length for the trigger signals "A" and "B", the present invention is able to select a combination of control gate and drain voltages in accordance with a predefined translation from a to-be-programmed data value. The control gate voltage produced by second variable voltage oscillating circuit 15 is sent to x-decoder 12. X-decoder 12 then selects a specific word line to apply the control gate voltage.

For example, in selecting memory cell M1 shown in FIG. 1 for programming, word line WL1 is selected. The drain voltage produced by first variable voltage oscillating circuit 17 is sent to bit line selector 14. Bit line selector 14 and y-decoder 13 then apply the drain voltage to bit line BL1. Accordingly, the voltage difference between its control gate and the drain of memory cell M1 is equal to the voltage difference between the voltages produced by second variable voltage oscillating 15 and first variable voltage oscillating circuit 17. When the voltage applied to the control gate is higher than the voltage applied to the drain, some of the electrons flowing in the channel region of memory cell M1 will tunnel through the thin oxide layer by Fowler-Nordheim tunneling to charge floating gate 52.

Figure 5:
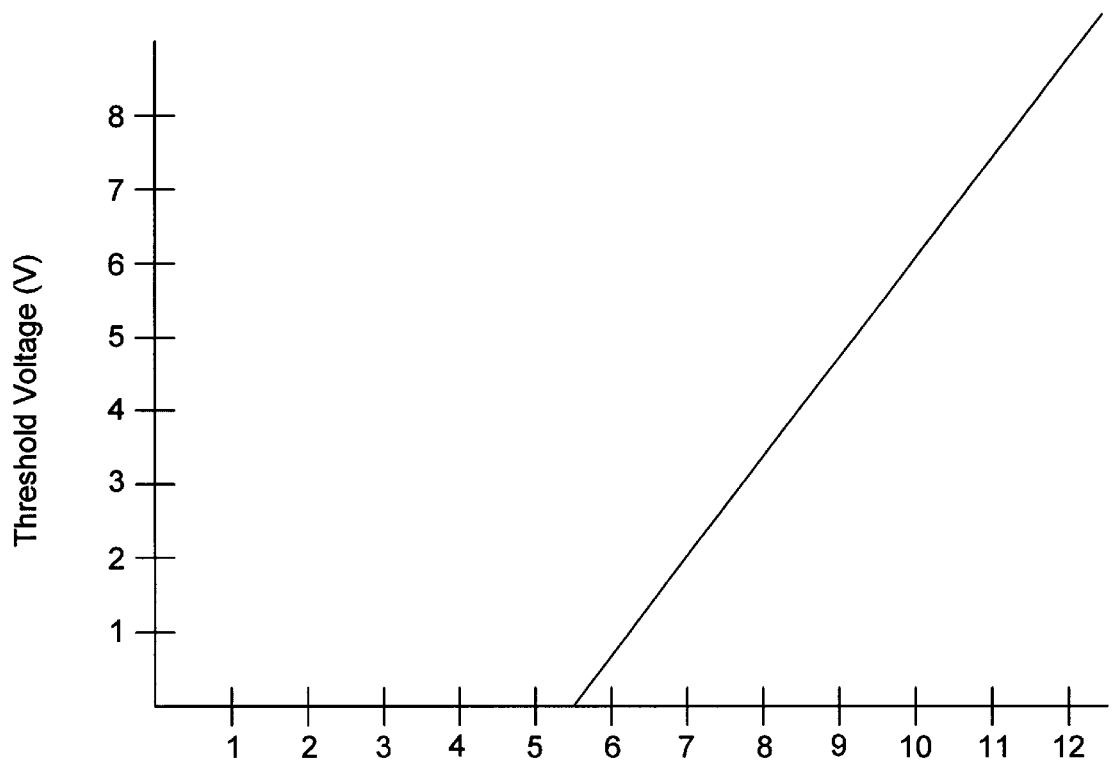
FIG. 5 is a graph showing the relationship between a threshold voltage and voltage difference between the control gate and the drain of a memory cell.

After a period of time, the potential difference between the floating gate and the drain will be balanced by the electrons stored on the floating gate. The amount of charge stored on the floating gate is directly correlated to the voltage difference between the gate and the drain after a period of time as shown in FIG. 5. The specifics of this relation are dependent on the characteristics of the thin oxide layer, such as its thickness, and so this chart is shown only as an example of this relationship.

Therefore, a memory cell having a certain amount of charge on its floating gate exhibits a threshold voltage equal to the amount of voltage that must be applied to the control gate of the memory cell in order to pinch off the channel region between the source and drain of the memory cell. The voltage that is applied to the control gate balances the charge on the floating gate such that the charge on the floating gate no longer creates a channel between the source and drain, and therefore no electron will flow therebetween. A given threshold voltage range is related to a preselected data value that can be programmed into the memory cell. Once the threshold voltage is reached, the control gate and drain voltages can be removed, and the electrons on the floating gate will remain until erased.

FIG. 5 shows an exemplary relationship between the voltage difference between the voltages respectively applied to the control gate and drain of a given memory cell, and the resulting threshold voltage of the memory cell. As an example, a voltage difference of 6V would produce a threshold voltage of 1V in the programmed memory cell.

Figure 6:
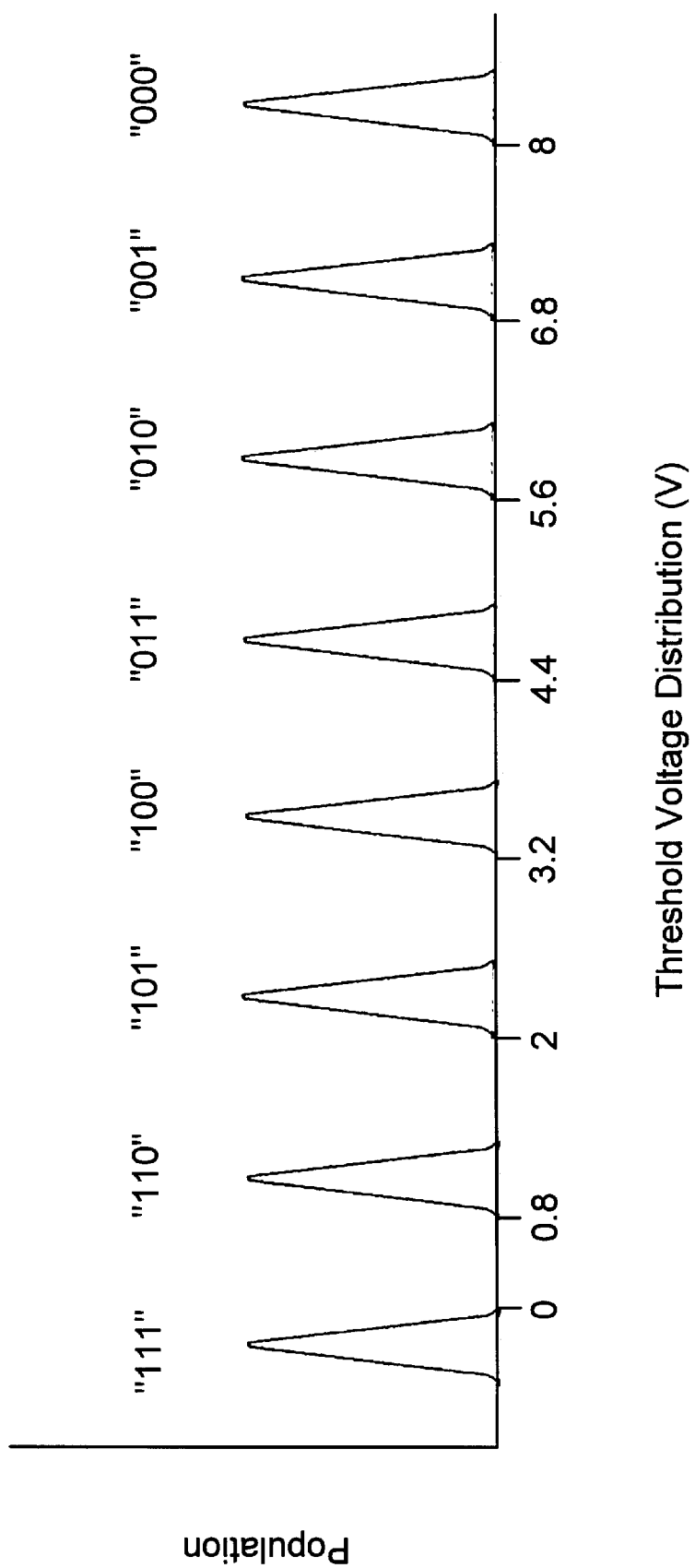
FIG. 6 is a chart relating threshold voltage values to logic values stored in a memory cell.

FIG. 6 is a graph showing an exemplary translation of threshold voltages into data values. This is a bidirectional translation, in that a certain range of threshold voltages is translated into a certain data value. In addition, to program a certain data value, a certain threshold voltage within a certain voltage range must be programmed into the memory cell to store that data value. To program a threshold voltage within a certain range of voltages into the memory cell, the data must be translated into a pair of trigger signals "A" and "B", which are selected to produce a threshold voltage on the floating gate of the selected memory cell. The durations of the trigger signals result in a selected voltage difference between the control gate and the drain of the memory cell, which produced a threshold voltage in the memory cell correlated to the data value. Further, when the data are read out from a memory cell as described below, the threshold voltage is actually read out and then translated into a data value.

The data values programmed into a memory cell are read out as follows. With reference to FIG. 2, a stepped voltage signal having values halfway between the possible threshold voltages of the selected memory cell is produced by second variable voltage oscillating circuit 15. The possible threshold voltages are shown, for example, in FIG. 6. The stepped voltage signal is then sent to x-decoder 12, which applies the stepped voltage to the word line for the selected memory cell. At the same time, a constant voltage is applied to bit line selector 14, and together with y-decoder 13, applies the constant voltage to the bit line for the selected memory cell.

Read circuit 16, which is coupled to the source lines SL1–SL4 of memory cell array 10, reads or "senses" whether a current has been produced by the constant voltage. When the stepped voltage signal is below the threshold voltage, a current will be produced. When the stepped voltage signal is above the threshold voltage, no current will be produced. Read circuit 16 then translates into data values the results of which of the stepped voltage produces a current flow in accordance with predetermined translation values as shown, for example, in FIG. 6.

It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A non-volatile semiconductor memory device including a memory cell array and capable of selectively writing one of a plurality of data values into individual memory cells in the memory cell array that includes rows and columns of memory cells, each of the memory cells having a control gate, a floating gate, a source and a drain, comprising:

a first variable voltage oscillating circuit for producing a first stepped voltage to be applied to a selected memory cell;

a second variable voltage oscillating circuit for producing a second stepped voltage to be applied to the selected memory cell.

2. The device of claim 1 wherein the first variable voltage oscillating circuit is coupled to apply the first stepped voltage to the drain of the selected memory cell, and the second variable voltage oscillating circuit is coupled to apply the second stepped voltage to the control gate of the selected memory cell.

3. The device of claim 1 further comprising:

an x-decoder coupled to the second variable voltage oscillating circuit for selecting a row of memory cells including the selected memory cell, and for applying the second stepped voltage to the control gates of the row of memory cells;

a bit line selector coupled to the first variable voltage oscillating circuit; and a y-decoder coupled to the bit line selector for selecting a column of memory cells including the selected memory cell, and for applying the first stepped voltage to the drains of the column of memory cells.

4. The device of claim 1 wherein the second variable voltage oscillating circuit provides all voltage levels of the second stepped voltage for one voltage level of the first stepped voltage.

5. The device of claim 1 wherein the data values which can be written into each of the memory cells is equal to a number of ranges of values of charge which can be stored on the floating gate of the memory cell.

6. The device of claim 1 further comprising:

a timing circuit for producing trigger signals in response to a data value to be stored, wherein the first variable voltage oscillating circuit and the second variable voltage oscillating circuit initiate the first and second stepped variable voltage signals upon receiving the trigger signals, and hold the voltage signals at respective constant voltage values when the trigger signals stop.

7. The device of claim 6 wherein the constant voltage value is equal to the value of the stepped variable voltage when the trigger signal stops.

8. The device of claim 6 wherein the trigger signals have the same time length.

9. The device of claim 1 further comprising a read circuit for setting the device into one of a write mode and a read mode.

10. A non-volatile memory device, comprising:

a memory array having a plurality of memory cells, each of the plurality of memory cells including a drain, a source, a control gate and a floating gate;

a first variable voltage oscillating circuit coupled to the drain of a selected one of the plurality of memory cells for providing a first stepped voltage waveform; and a second variable voltage oscillating circuit coupled to the control gate of the selected one of the plurality of memory cells for providing a second stepped voltage waveform;

wherein the first stepped voltage waveform and the second stepped voltage waveform cause the selected one of the plurality of memory cells to store one of a plurality of data values.

11. The device of claim 10, wherein the second variable voltage oscillating circuit provides all voltage levels of the second stepped voltage for one voltage level of the first stepped voltage.

12. The device of claim 10 wherein the data values which can be written into each of the plurality of memory cells is equal to a number of ranges of values of charge which can be stored on the floating gate of the memory cell.

13. The device of claim 10 further comprising a timing circuit for producing trigger signals in response to a data value to be stored.

14. The device of claim 13 wherein the first variable voltage oscillating circuit and the second variable voltage oscillating circuit initiate the first and second stepped variable voltage signals upon receiving the trigger signals, and hold the voltage signals at respective constant voltage values when the trigger signals stop.

15. A method of selectively writing one of a plurality of possible data values into a non-volatile semiconductor memory device having a memory array including a plurality of memory cells, each of the memory cells having a control gate, a floating gate, a channel region, a drain, and a source, comprising:

receiving a data value to be written into a memory cell;

translating the received data value into a threshold voltage to be written into the memory cell;

applying a first stepped voltage to the control gate of the memory cell; and applying a second stepped voltage to the drain of the memory cell.

16. The method of claim 15 further comprising halting the stepping of the first stepped voltage and the second stepped voltage when the voltage difference between the first stepped voltage and the second stepped voltage is equal to a voltage necessary to write the threshold voltage into the memory cell.

17. The method of claim 15 wherein the first stepped voltage and the second stepped voltage produce a voltage difference between the floating gate and the channel region of the memory cell, thereby causing electrons to tunnel onto the floating gate from the channel region.

18. The method of claim 15 wherein the step of applying a first stepped voltage includes repeating all of the voltage steps of the first stepped voltage for each of the voltage steps of the second stepped voltage.

19. The method of claim 15 wherein the step of applying a first stepped voltage includes stepping the voltage every 0.5 ms of a first trigger signal.

20. The method of claim 15 wherein the step of applying a second stepped voltage includes stepping the voltage every 2.0 ms of a second trigger signal.

* * * * *